US012437970B2

(12) United States Patent
Koshimizu et al.

(10) Patent No.: US 12,437,970 B2
(45) Date of Patent: Oct. 7, 2025

(54) PLASMA PROCESSING METHOD AND PLASMA PROCESSING APPARATUS

(71) Applicant: Tokyo Electron Limited, Tokyo (JP)

(72) Inventors: Chishio Koshimizu, Miyagi (JP); Shin Hirotsu, Miyagi (JP); Takenobu Ikeda, Miyagi (JP); Koichi Nagami, Miyagi (JP); Shinji Himori, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 159 days.

(21) Appl. No.: 18/448,077

(22) Filed: Aug. 10, 2023

(65) Prior Publication Data

US 2024/0006154 A1 Jan. 4, 2024

Related U.S. Application Data

(63) Continuation of application No. 16/878,098, filed on May 19, 2020, now Pat. No. 11,764,034.

(30) Foreign Application Priority Data

May 28, 2019 (JP) ................................ 2019-099249

(51) Int. Cl.
*H01J 37/32* (2006.01)
*H01H 1/46* (2006.01)
*H05H 1/00* (2006.01)

(52) U.S. Cl.
CPC ......... *H01J 37/32183* (2013.01); *H01H 1/46* (2013.01); *H01J 37/32568* (2013.01); *H01J 37/32715* (2013.01); *H05H 1/01* (2021.05)

(58) Field of Classification Search
CPC ........... H01J 37/32183; H01J 37/32568; H01J 37/32715; H01J 37/32174;
(Continued)

(56) References Cited

U.S. PATENT DOCUMENTS 7,821,767 B2 * 10/2010 Fujii .................. H01L 21/6833 361/234
2010/0072172 A1 3/2010 Ui et al.
(Continued)

FOREIGN PATENT DOCUMENTS

CN 104756238 B 12/2017
JP 2009-187975 A 8/2009
(Continued)

*Primary Examiner* — Renan Luque
(74) *Attorney, Agent, or Firm* — Studebaker Brackett PLLC

(57) ABSTRACT

A plasma processing method according to an exemplary embodiment includes applying a first direct-current voltage to a lower electrode of a substrate support provided in a chamber of a plasma processing apparatus, in a first period during generation of plasma in the chamber. The plasma processing method further includes applying a second direct-current voltage to the lower electrode in a second period different from the first period during generation of plasma in the chamber. The second direct-current voltage has a level different from a level of the first direct-current voltage. The second direct-current voltage has a same polarity as a polarity of the first direct-current voltage.

15 Claims, 11 Drawing Sheets

(58) Field of Classification Search
CPC ........... H01J 37/32137; H01J 37/32146; H01J 37/32577; H01H 1/46; H05H 1/01
See application file for complete search history.

(56) References Cited

U.S. PATENT DOCUMENTS

| | | | |
|---|---|---|---|
| 2018/0166341 | A1 | 6/2018 | Chan et al. |
| 2019/0088520 | A1* | 3/2019 | Kraus ............... H01J 37/32568 |
| 2019/0088522 | A1* | 3/2019 | Lindley ............... H01L 21/6833 |

FOREIGN PATENT DOCUMENTS

| | | | |
|---|---|---|---|
| JP | 2011-162830 | A | 8/2011 |
| JP | 2016-066593 | A | 4/2016 |
| JP | 2019-036658 | A | 3/2019 |
| KR | 10-2016-0033034 | A | 3/2016 |
| WO | 2014/035897 | A1 | 3/2014 |
| WO | 2014/035899 | A1 | 3/2014 |

* cited by examiner

PLASMA PROCESSING METHOD AND PLASMA PROCESSING APPARATUS

CROSS-REFERENCE TO RELATED APPLICATIONS

This application is a Continuation of U.S. patent application Ser. No. 16/878,098 filed May 19, 2020, which is based on and claims the benefit of priority from Japanese Patent Application No. 2019-099249 filed on May 28, 2019, the entire contents of which are incorporated herein by reference.

TECHNICAL FIELD

Exemplary embodiments of the present disclosure relate to a plasma processing method and a plasma processing apparatus.

BACKGROUND

A plasma processing apparatus is used in plasma processing on a substrate. The plasma processing apparatus includes a chamber and a substrate holding electrode. The substrate holding electrode is provided in the chamber. The substrate holding electrode holds a substrate placed on a principal surface thereof. One type of such a plasma processing apparatus is disclosed in Japanese Patent Application Laid-Open Publication No. 2009-187975 (hereinafter referred to as "JP 2009-187975 A").

The plasma processing apparatus disclosed in JP 2009-187975 A further includes a radio frequency generator and a direct-current negative pulse generator. The radio frequency generator applies a radio frequency voltage to the substrate holding electrode. In the plasma processing apparatus disclosed in JP 2009-187975 A, the radio frequency voltage are alternately switched on and off. Further, in the plasma processing apparatus disclosed in JP 2009-187975 A, a direct-current negative pulse voltage is applied from the direct-current negative pulse generator to the substrate holding electrode in accordance with the on/off timing of the radio frequency voltage. In the plasma processing apparatus disclosed in JP 2009-187975 A, the energy of ions which are supplied to the substrate when the direct-current negative pulse voltage, that is, a negative pulsed direct-current voltage is applied to the substrate holding electrode becomes the maximum. The energy of ions which are supplied to the substrate when the direct-current negative pulse voltage is not applied to the substrate becomes the minimum.

SUMMARY

In an exemplary embodiment, a plasma processing method is provided. The plasma processing method includes applying a first direct-current voltage to a lower electrode of a substrate support provided in a chamber of a plasma processing apparatus, in a first period during generation of plasma in the chamber. The plasma processing method further includes applying a second direct-current voltage to the lower electrode in a second period different from the first period during generation of the plasma in the chamber. The second direct-current voltage has a level different from a level of the first direct-current voltage. The second direct-current voltage has a same polarity as a polarity of the first direct-current voltage.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
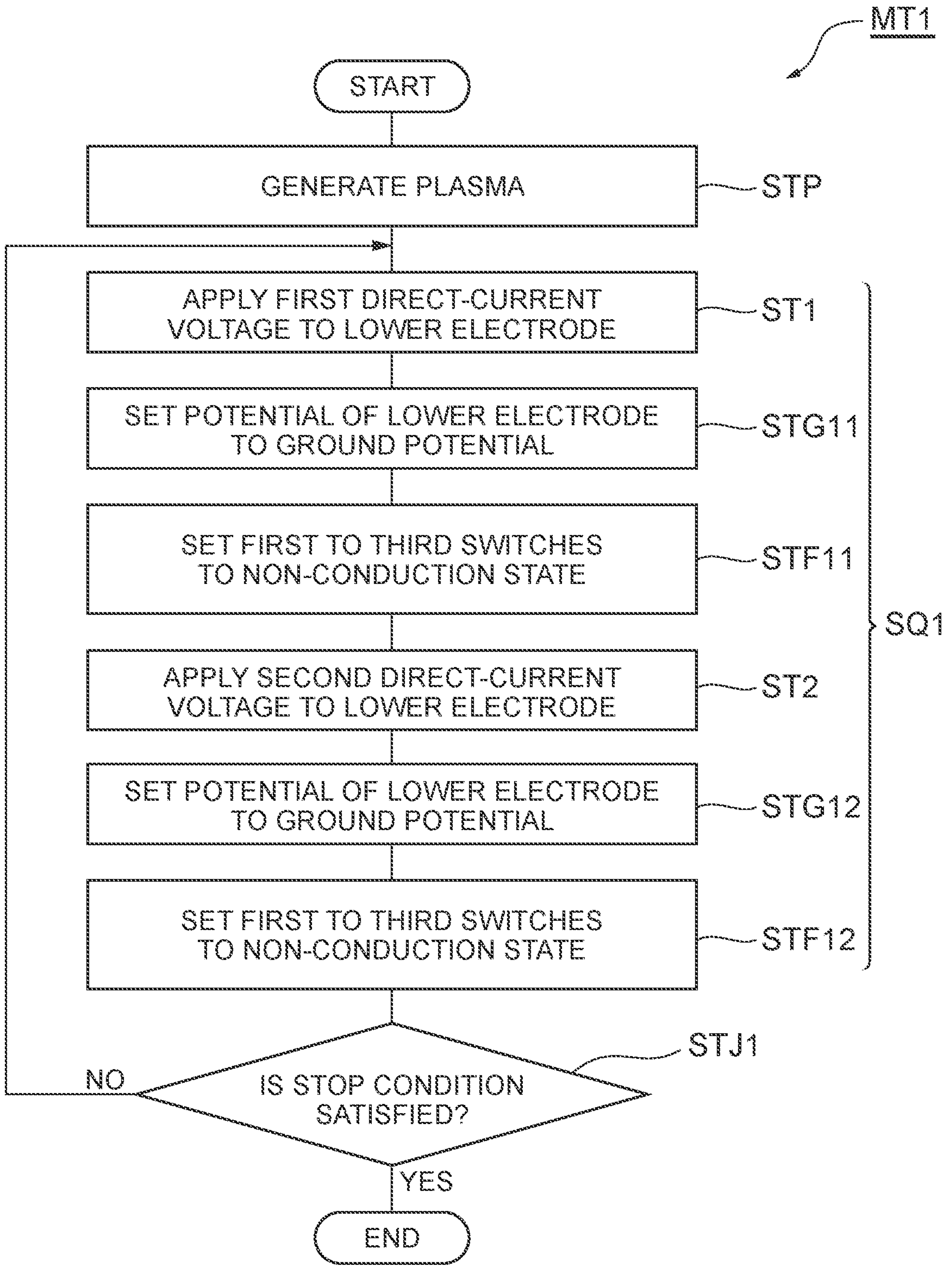
FIG. 1 is a flowchart of a plasma processing method according to an exemplary embodiment.

Hereinafter, various exemplary embodiments will be described.

In an exemplary embodiment, a plasma processing method is provided. The plasma processing method includes applying a first direct-current voltage to a lower electrode of a substrate support provided in a chamber of a plasma processing apparatus, in a first period during generation of plasma in the chamber. The plasma processing method further includes applying a second direct-current voltage to the lower electrode in a second period during generation of the plasma in the chamber. The second period is a period different from the first period. The second direct-current voltage has a level different from a level of the first direct-current voltage. The second direct-current voltage has the same polarity as a polarity of the first direct-current voltage.

In the plasma processing method of the above embodiment, the first direct-current voltage and the second direct-current voltage have the same polarity as each other. Further, the absolute value of one of the first direct-current voltage and the second direct-current voltage is smaller than the absolute value of the other direct-current voltage. Therefore, the energy of ions which are supplied to the substrate in one period of the first period and the second period, in which the direct-current voltage is applied to the lower electrode, is lower than the energy of ions which are supplied to the substrate in the other period. Further, the energy of ions which are supplied to the substrate in the one period is higher than the energy which is supplied to the substrate if the potential of the lower electrode is a ground potential. Therefore, ions having the energy between the energy of ions which are supplied to the substrate when a single level direct-current voltage is applied to the lower electrode and the energy of ions which are supplied to the substrate if the potential of the lower electrode is a ground potential can be supplied to the substrate.

In an exemplary embodiment, the plasma processing apparatus may include a power source device, a first switch, and a second switch. In this embodiment, the power source device has a first output for the first direct-current voltage and a second output for the second direct-current voltage. The first switch is connected between the first output and the lower electrode. The second switch is connected between the second output and the lower electrode. In the first period, the first switch is set to a conduction state to connect the first output and the lower electrode to each other and the second switch is set to a non-conduction state to break a connection between the second output and the lower electrode. In the second period, the second switch is set to a conduction state to connect the second output and the lower electrode to each other and the first switch is set to a non-conduction state to break a connection between the first output and the lower electrode.

In an exemplary embodiment, the plasma processing method further includes setting a potential of the lower electrode to a ground potential in a third period. The third period is a period between the point in time of the end of the first period and the point in time of the start of the second period. In this embodiment, the plasma processing apparatus further includes a third switch connected between the lower electrode and a ground. In the first period and the second period, the third switch is set to a non-conduction state to break a connection between the lower electrode and the ground. In the third period, the third switch is set to a conduction state to connect the lower electrode and the ground to each other. Further, in the third period, the first switch is set to a non-conduction state to break a connection between the first output and the lower electrode and the second switch is set to a non-conduction state to break a connection between the second output and the lower electrode.

In an exemplary embodiment, the plasma processing method may further include setting the first switch, the second switch, and the third switch to a non-conduction state in a period between the point in time of the end of the third period and the point in time of the start of the second period.

In an exemplary embodiment, the applying the first direct-current voltage and the applying the second direct-current voltage may be alternately repeated. In an exemplary embodiment, the plasma processing method may further include setting the potential of the lower electrode to the ground potential in a period between the point in time of the end of the second period and the point in time of the start of the next first period.

In another exemplary embodiment, a plasma processing apparatus is provided. The plasma processing apparatus includes a chamber, a substrate support, a power source device, and a controller. The substrate support includes a lower electrode and is provided in the chamber. The controller is configured to control application of a voltage from the power source device to the lower electrode. The controller is configured to execute first control of applying a first direct-current voltage from the power source device to the lower electrode in a first period during generation of plasma in the chamber. The controller is configured to further execute second control of applying a second direct-current voltage from the power source device to the lower electrode in a second period during generation of the plasma in the chamber. The second period is a period different from the first period. The second direct-current voltage has a level different from a level of the first direct-current voltage and has the same polarity as a polarity of the first direct-current voltage.

In an exemplary embodiment, the power source device may have a first output for the first direct-current voltage and a second output for the second direct-current voltage. In this embodiment, the plasma processing apparatus may further include a first switch and a second switch. The first switch is connected between the first output and the lower electrode. The second switch is connected between the second output and the lower electrode. The controller is configured to set the first switch to a conduction state to connect the first output and the lower electrode to each other, and set the second switch to a non-conduction state to break a connection between the second output and the lower electrode, in the first control. The controller is configured to set the second switch to a conduction state to connect the second output and the lower electrode to each other, and set the first switch to a non-conduction state to break a connection between the first output and the lower electrode, in the second control.

In an exemplary embodiment, the plasma processing apparatus may further include a third switch connected between the lower electrode and a ground. The controller is configured to set the third switch to a non-conduction state to break a connection between the lower electrode and the ground, in the first control and the second control. The controller is configured to further execute control of setting the third switch to a conduction state to connect the lower electrode and the ground to each other, in a third period. The third period is a period between the point in time of the end of the first period and the point in time of the start of the second period. The controller is configured to set the first switch to a non-conduction state to break a connection between the first output and the lower electrode, and set the second switch to a non-conduction state to break a connection between the second output and the lower electrode, in the control in the third period.

In an exemplary embodiment, the controller may be configured to further execute control of setting the first switch, the second switch, and the third switch to a non-conduction state in a period between the point in time of the end of the third period and the point in time of the start of the second period.

In an exemplary embodiment, the controller may be configured to alternately repeat the first control and the second control. In an exemplary embodiment, the controller may further execute an other control in a period between the point in time of the end of the second period and the point in time of the start of the next first period. The controller is configured to set the third switch to a conduction state to connect the lower electrode and the ground to each other, in the other control described above. The controller is configured to set the first switch to a non-conduction state to break a connection between the first output and the lower electrode, and set the second switch to a non-conduction state to break a connection the connection between the second output and the lower electrode, in the other control described above.

In still another exemplary embodiment, a plasma processing method is provided. The plasma processing method includes applying a direct-current voltage from a power source device to a lower electrode of a substrate support provided in a chamber of a plasma processing apparatus in a first period during generation of plasma in the chamber. The plasma processing method further includes connecting the lower electrode to a ground in a second period during generation of the plasma in the chamber. The second period is a period different from the first period. In the second period, the lower electrode is electrically separated from the power source device. The plasma processing method further includes connecting the power source device to the lower electrode in a third period during generation of the plasma in the chamber. The third period is a period after the second period and starts before the potential of the lower electrode reaches the ground potential. In the third period, the lower electrode is electrically separated from the ground. The point in time of the end of the third period is a point in time before the potential of the lower electrode reaches a steady state. At the point in time of the end of the third period, the lower electrode is electrically separated from the power source device.

In the plasma processing method of the above embodiment, in the second period, the absolute value of the potential of the lower electrode decreases from the absolute value of the potential of the lower electrode in the first period. However, it does not reach zero. Further, in the third period, the absolute value of the potential of the lower electrode increases from the absolute value of the potential of the lower electrode in the second period. However, it does not reach the same potential as the potential of the lower electrode in the first period. Therefore, the energy of ions which are supplied to the substrate in the second period and the energy of ions which are supplied to the substrate in the third period are lower than the energy of ions which are supplied to the substrate in the first period. Further, the energy of ions which are supplied to the substrate in the second period and the energy of the ions which are supplied to the substrate in the third period are higher than the energy which is supplied to the substrate if the potential of the lower electrode is the ground potential. Therefore, ions having the energy between the energy of ions which are supplied to the substrate when a single level direct-current voltage is applied to the lower electrode and the energy of ions which are supplied to the substrate if the potential of the lower electrode is a ground potential can be supplied to the substrate.

In an exemplary embodiment, the plasma processing method may further include electrically separating the lower electrode from both the power source device and the ground in a period between the point in time of the end of the second period and the point in time of the start of the third period.

In an exemplary embodiment, the connecting the lower electrode to the ground and the connecting the power source device to the lower electrode may be alternately repeated. In this embodiment, the connecting the lower electrode to the ground is initiated again before the potential of the lower electrode reaches a steady state after the execution of the connecting the power source device to the lower electrode.

In still another exemplary embodiment, a plasma processing apparatus is provided. The plasma processing apparatus includes a chamber, a substrate support, a power source device, a first switch, a second switch, and a controller. The substrate support includes a lower electrode and is provided in the chamber. The first switch is connected between the power source device and the lower electrode. The second switch is connected between the lower electrode and a ground. The controller is configured to control application of a voltage from the power source device to the lower electrode. The controller is configured to execute first control in a first period during generation of plasma in the chamber. The controller is configured to set the first switch to a conduction state in the first control to connect the power source device to the lower electrode to apply a direct-current voltage from the power source device to the lower electrode. The controller is configured to set the second switch to a non-conduction state in the first control to electrically separate the lower electrode from the ground. The controller is configured to further execute second control in a second period during generation of the plasma in the chamber. The second period is a period different from the first period. The controller is configured to set the second switch to a conduction state to connect the lower electrode to the ground, and set the first switch to a non-conduction state to electrically separate the lower electrode from the power source device, in the second control. The controller is configured to further execute third control in a third period during generation of the plasma in the chamber. The third period is a period after the second period and starts before the potential of the lower electrode reaches the ground potential. The controller is configured to set the first switch to a conduction state to connect the power source device to the lower electrode, and set the second switch to a non-conduction state to electrically separate the lower electrode from the ground, in the third control. The point in time of the end of the third period is a point in time before the potential of the lower electrode reaches a steady state. The controller is configured to set the first switch to a non-conduction state to electrically separate the lower electrode from the power source device, at the point in time of the end of the third period.

In an exemplary embodiment, the controller may be configured to further execute an other control in a period between the point in time of the end of the second period and the point in time of the start of the third period. The controller may be configured to set both the first switch and the second switch to a non-conduction state to electrically separate the lower electrode from both the power source device and the ground, in the other control described above.

In an exemplary embodiment, the controller may be configured to alternately repeat the second control and the third control and initiate the execution of the second control again before the potential of the lower electrode reaches a steady state after the execution of the third control.

In still another exemplary embodiment, a plasma processing method is provided. The plasma processing method includes applying a first direct-current voltage from a first output of a power source device to a lower electrode of a substrate support provided in a chamber of a plasma processing apparatus, in a first period during generation of plasma in the chamber. The power source device has a first output and a second output. The second output is an output for a second direct-current voltage having a level lower than a level of the first direct-current voltage. The plasma processing method further includes connecting the lower electrode to a ground in a second period during generation of the plasma in the chamber. The second period is a period different from the first period. In the second period, the lower electrode is electrically separated from the first output and the second output. The plasma processing method further includes connecting the second output to the lower electrode in a third period during generation of plasma in the chamber. The third period is a period after the second period and starts before the potential of the lower electrode reaches the ground potential. In the third period, the lower electrode is electrically separated from the first output and the ground. The point in time of the end of the third period is a point in time before the potential of the lower electrode reaches a steady state. At the point in time of the end of the third period, the lower electrode is electrically separated from the first output and the second output.

In the plasma processing method of the above embodiment, in the second period, the absolute value of the potential of the lower electrode decreases from the absolute value of the potential of the lower electrode in the first period. However, it does not reach zero. Further, in the third period, the absolute value of the potential of the lower electrode increases from the absolute value of the potential of the lower electrode in the second period. However, it does not reach the same potential as the potential of the lower electrode in the first period. Therefore, the energy of ions which are supplied to the substrate in the second period and the energy of ions which are supplied to the substrate in the third period are lower than the energy of ions which are supplied to the substrate in the first period. Further, the energy of ions which are supplied to the substrate in the second period and the energy of the ions which are supplied to the substrate in the third period are higher than the energy which is supplied to the substrate if the potential of the lower electrode is the ground potential. Therefore, ions having the energy between the energy of ions which are supplied to the substrate when a single level direct-current voltage is applied to the lower electrode and the energy of ions which are supplied to the substrate if the potential of the lower electrode is a ground potential can be supplied to the substrate.

In an exemplary embodiment, the plasma processing method may further include electrically separating the lower electrode from the first output, the second output, and the ground in a period between the point in time of the end of the second period and the point in time of the start of the third period.

In an exemplary embodiment, the connecting the lower electrode to the ground and the connecting the second output to the lower electrode may be alternately repeated. In this embodiment, the connecting the lower electrode to the ground is initiated again before the potential of the lower electrode reaches a steady state after the execution of the connecting the second output to the lower electrode.

In still another exemplary embodiment, a plasma processing apparatus is provided. The plasma processing apparatus includes a chamber, a substrate support, a power source device, a first switch, a second switch, a third switch, and a controller. The substrate support includes a lower electrode and is provided in the chamber. The power source device has a first output for a first direct-current voltage and a second output for a second direct-current voltage. The second direct-current voltage has a level lower than the level of the first direct-current voltage. The first switch is connected between the first output and the lower electrode. The second switch is connected between the second output and the lower electrode. The third switch is connected between the lower electrode and a ground. The controller is configured to control application of a voltage from the power source device to the lower electrode. The controller is configured to execute first control in a first period during generation of plasma in the chamber. The controller is configured to set the first switch to a conduction state to apply a first direct-current voltage from the first output to the lower electrode by connecting the first output to the lower electrode, in first control. The controller is configured to set the second switch and the third switch to a non-conduction state to electrically separate the lower electrode from the second output and the ground, in the first control. The controller is configured to further execute second control in a second period during generation of the plasma in the chamber. The second period is a period different from the first period. The controller is configured to set the third switch to a conduction state to connect the lower electrode to the ground, and set the first switch and the second switch to a non-conduction state to electrically separate the lower electrode from the first output and the second output, in the second control. The controller is configured to further execute third control in a third period during generation of the plasma in the chamber. The third period is a period after the second period and starts before the potential of the lower electrode reaches the ground potential. The controller is configured to set the second switch to a conduction state to connect the second output to the lower electrode, and set the first switch and the third switch to a non-conduction state to electrically separate the lower electrode from the first output and the ground, in third control. The point in time of the end of the third period is a point in time before the potential of the lower electrode reaches a steady state. The controller is configured to set the first switch and the second switch to a non-conduction state to electrically separate the lower electrode from the first output and the second output, at the point in time of the end of the third period.

In an exemplary embodiment, the controller may be configured to further execute control of setting the first to third switches to a non-conduction state in a period between the point in time of the end of the second period and the point in time of the start of the third period.

In an exemplary embodiment, the controller may alternately repeat the second control and the third control. The controller may be configured to initiate the execution of the second control again before the potential of the lower electrode reaches a steady state after the execution of the third control.

Hereinafter, various embodiments will be described in detail with reference to the drawings. In the drawing, the same or equivalent portions are denoted by the same reference symbols.

Figure 2:
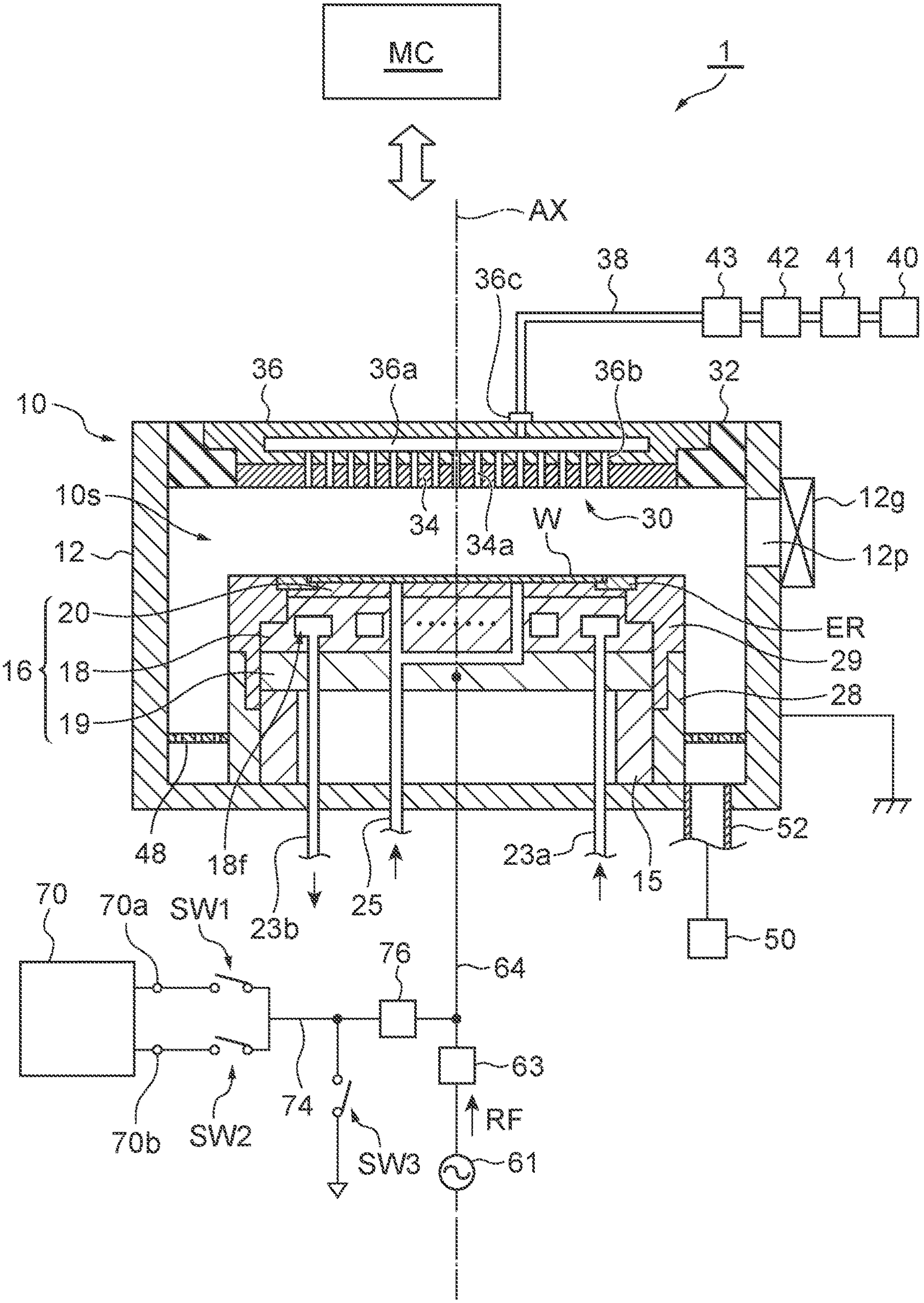
FIG. 2 schematically illustrates a plasma processing apparatus according to an exemplary embodiment.

FIG. 1 is a flowchart of a plasma processing method according to an exemplary embodiment. The plasma processing method (hereinafter, referred to as a "method MT1") shown in FIG. 1 is executed using a plasma processing apparatus. FIG. 2 schematically illustrates a plasma processing apparatus according to an exemplary embodiment. The method MT1 may be performed using a plasma processing apparatus 1 shown in FIG. 2.

The plasma processing apparatus 1 is a capacitively-coupled plasma processing apparatus. The plasma processing apparatus 1 is provided with a chamber 10. The chamber 10 provides an internal space 10*s* therein. In an embodiment, the chamber 10 includes a chamber body 12. The chamber body 12 has a substantially cylindrical shape. The internal space 10*s* is provided in the chamber body 12. The chamber body 12 is made of, for example, aluminum. The chamber body 12 is electrically grounded. A film having plasma resistance is formed on the inner wall surface of the chamber body 12, that is, a wall surface defining the internal space 10*s*. This film may be a ceramic film such as a film formed by anodization or a film formed of yttrium oxide.

A passage 12*p* is formed in a side wall of the chamber body 12. A substrate W passes through the passage 12*p* when it is transported between the internal space 10*s* and the outside of the chamber 10. A gate valve 12*g* is provided along the side wall of the chamber body 12 in order to open and close the passage 12*p*.

The plasma processing apparatus 1 further includes a substrate support 16. The substrate support 16 is provided in the chamber 10, that is, in the internal space 10*s*. The substrate support 16 is configured to support the substrate W placed thereon. The substrate W may have a substantially disk shape. The substrate support 16 is supported by a support 15. The support 15 extends upward from a bottom portion of the chamber body 12. The support 15 has a substantially cylindrical shape. The support 15 is formed of an insulating material such as quartz.

The substrate support 16 includes a lower electrode 18. The substrate support 16 may further include an electrostatic chuck 20. The substrate support 16 may further include an electrode plate 19. The electrode plate 19 is formed of a conductive material such as aluminum and has a substantially disk shape. The lower electrode 18 is provided on the electrode plate 19. The lower electrode 18 is formed of a conductive material such as aluminum and has a substantially disk shape. The lower electrode 18 is electrically connected to the electrode plate 19.

A flow path **18*f* is formed in the lower electrode 18. The flow path 18*f* is a flow path for a heat exchange medium. As the heat exchange medium, a liquid refrigerant or a refrigerant (for example, Freon) that cools the lower electrode 18 by vaporization thereof is used. A heat exchange medium supply device (for example, a chiller unit) is connected to the flow path 18*f*. This supply device is provided outside the chamber 10. The heat exchange medium is supplied to the flow path 18*f* from the supply device through a pipe 23*a*. The heat exchange medium supplied to the flow path 18*f* is returned to the supply device through a pipe 23*b***.

The electrostatic chuck 20 is provided on the lower electrode 18. When the substrate W is processed in the internal space **10*s*, the substrate W is placed on the electrostatic chuck 20 and is held by the electrostatic chuck 20. The electrostatic chuck 20 has a main body and an electrode. The main body of the electrostatic chuck 20 is formed of a dielectric such as aluminum oxide or aluminum nitride. The main body of the electrostatic chuck 20 has a substantially disk shape. The electrostatic chuck 20 includes a substrate placing area and an edge ring mounting area. The substrate placing area is an area having a substantially disk shape. The upper surface of the substrate placing area extends along a horizontal plane. An axis AX that includes the center of the substrate placing area and extends in a vertical direction substantially coincides with the central axis of the chamber 10. When the substrate W is processed in the chamber 10**, the substrate W is placed on the upper surface of the substrate placing area.

The edge ring mounting area extends in a circumferential direction so as to surround the substrate placing area. An edge ring ER is mounted on the upper surface of the edge ring mounting area. The edge ring ER has a ring shape. The substrate W is disposed in an area surrounded by the edge ring ER. That is, the edge ring ER surrounds the edge of the substrate W placed on the substrate placing area of the electrostatic chuck 20. The edge ring ER is formed of, for example, silicon or silicon carbide.

The electrode of the electrostatic chuck 20 is provided in the main body of the electrostatic chuck 20. The electrode of the electrostatic chuck 20 is a film formed of a conductor. A direct-current power source is electrically connected to the electrode of the electrostatic chuck 20. If a direct-current voltage is applied from the direct-current power source to the electrode of the electrostatic chuck 20, an electrostatic attraction force is generated between the electrostatic chuck 20 and the substrate W. The substrate W is attracted to the electrostatic chuck 20 by the generated electrostatic attraction force and is held by the electrostatic chuck 20.

The plasma processing apparatus 1 may further include a gas supply line 25. The gas supply line 25 supplies the heat transfer gas, for example, He gas, from a gas supply mechanism to a gap between the upper surface of the electrostatic chuck 20 and the back surface (lower surface) of the substrate W.

The plasma processing apparatus 1 may further include a tubular part 28 and an insulating part 29. The tubular part 28 extends upward from the bottom portion of the chamber body 12. The tubular part 28 extends along the outer periphery of the support 15. The tubular part 28 is formed of a conductive material and has a substantially cylindrical shape. The tubular part 28 is electrically grounded. The insulating part 29 is provided on the tubular part 28. The insulating part 29 is formed of a material having insulation properties. The insulating part 29 is formed of, for example, ceramic such as quartz. The insulating part 29 has a substantially cylindrical shape. The insulating part 29 extends along the outer periphery of the electrode plate 19, the outer periphery of the lower electrode 18, and the outer periphery of the electrostatic chuck 20.

The plasma processing apparatus 1 further includes an upper electrode 30. The upper electrode 30 is provided above the substrate support 16. The upper electrode 30 closes an upper opening of the chamber body 12 together with a member 32. The member 32 has insulation properties. The upper electrode 30 is supported on the upper portion of the chamber body 12 through the member 32.

The upper electrode 30 includes a ceiling plate 34 and a support 36. The lower surface of the ceiling plate 34 defines the internal space **10*s*. A plurality of gas delivery holes 34*a* are formed in the ceiling plate 34. Each of the plurality of gas delivery holes 34*a* penetrates the ceiling plate 34 in a plate thickness direction (vertical direction). The ceiling plate 34 is formed of, for example, silicon. However, there is no limitation thereto. Alternatively, the ceiling plate 34** may have a structure in which a plasma-resistant film is provided on the surface of a member made of aluminum. This film may be a ceramic film such as a film formed by anodization or a film formed of yttrium oxide.

The support 36 detachably supports the ceiling plate 34. The support 36 is formed of a conductive material such as aluminum, for example. A gas diffusion chamber **36*a* is provided in the interior of the support 36. A plurality of gas holes 36*b* extend downward from the gas diffusion chamber 36*a*. The plurality of gas holes 36*b* communicate with the plurality of gas delivery holes 34*a*, respectively. The support 36 has a gas introduction port 36*c* formed therein. The gas introduction port 36*c* is connected to the gas diffusion chamber 36*a*. A gas supply pipe 38 is connected to the gas introduction port 36*c***.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply the gas from one or more gas sources selected from the plurality of gas sources of the gas source group 40 to the internal space 10*s* at a flow rate individually adjusted.

A baffle member 48 is provided between the tubular part 28 and the side wall of the chamber body 12. The baffle member 48 may be a plate-shaped member. The baffle member 48 may be configured, for example, by coating a plate material made of aluminum with ceramic such as yttrium oxide. The baffle member 48 has a plurality of through-holes. An exhaust pipe 52 is connected to the bottom portion of the chamber body 12 below the baffle member 48. An exhaust device 50 is connected to the exhaust pipe 52. The exhaust device 50 has a pressure controller such as an automatic pressure control valve, and a vacuum pump such as a turbo molecular pump, and can reduce the pressure in the internal space 10*s*.

The plasma processing apparatus 1 further includes a radio frequency power source 61. The radio frequency power source 61 is a power source that generates a radio frequency power RF for plasma generation. The frequency of the radio frequency power RF is a frequency in the range of 27 to 100 MHz, and is, for example 40 MHz or 60 MHz, but is not limited thereto. The radio frequency power source 61 is connected to the lower electrode 18 through a matcher 63 and the electrode plate 19 in order to supply the radio frequency power RF to the lower electrode 18. The matcher 63 has a matching circuit for matching the output impedance of the radio frequency power source 61 and the impedance on the load side (the lower electrode 18 side) with each other. The radio frequency power source 61 may not be electrically connected to the lower electrode 18 and may be connected to the upper electrode 30 through the matcher 63.

The plasma processing apparatus 1 further includes a power source device 70. The power source device 70 has a first output 70*a* and a second output 70*b*. The first output 70*a* is an output for a first direct-current voltage which is generated by the power source device 70. The second output 70*b* is an output for a second direct-current voltage which is generated by the power source device 70. The second direct-current voltage has the same polarity as the polarity of the first direct-current voltage. The polarity of the first direct-current voltage and the polarity of the second direct-current voltage are, for example, negative. The polarity of the first direct-current voltage and the polarity of the second direct-current voltage may be positive. The second direct-current voltage has a level different from the level of the first direct-current voltage. In an embodiment, the level (absolute value) of the second direct-current voltage is lower than the level (absolute value) of the first direct-current voltage. The level (absolute value) of the second direct-current voltage may be higher than the level (absolute value) of the first direct-current voltage.

Figure 3A:
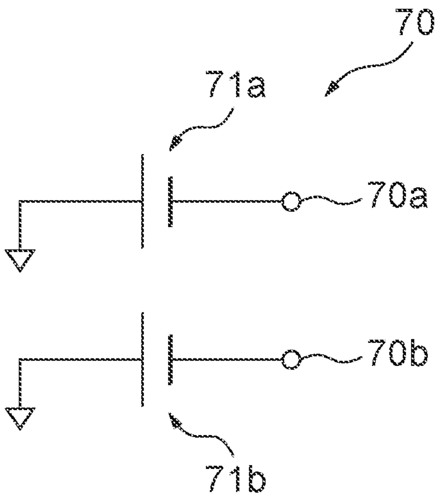
FIGS. 3A and 3B are diagrams showing a configuration of a power source device of the plasma processing apparatus shown in FIG. 2.
Figure 3B:
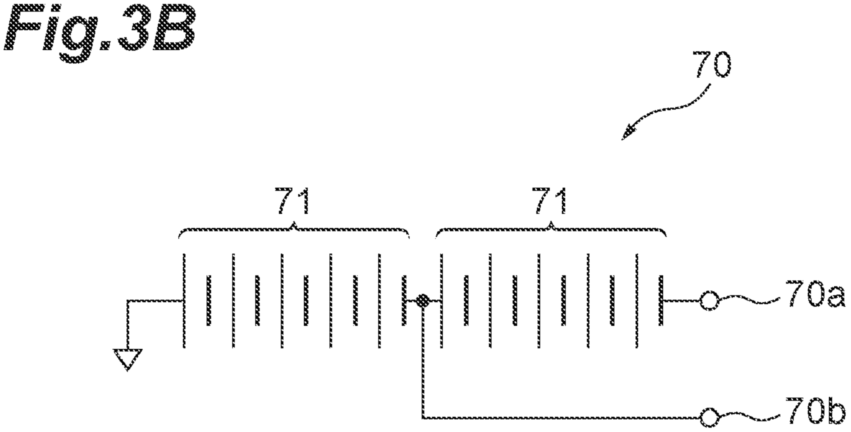

FIGS. 3A and 3B are diagrams showing the configuration of the power source device of the plasma processing apparatus shown in FIG. 2. As shown in FIG. 3A, the power source device 70 may include a direct-current power source 71*a* and a direct-current power source 71*b*. In the power source device 70 shown in FIG. 3A, the direct-current power source 71*a* is connected to the first output 70*a*, and the direct-current power source 71*b* is connected to the second output 70*b*.

As shown in FIG. 3B, the power source device 70 may include a plurality of direct-current power sources 71 connected in series. In the power source device 70 shown in FIG. 3B, the first output 70*a* is connected to an end portion on the side opposite to an end portion of the ground side of the series connection of the plurality of direct-current power sources 71. In the power source device 70 shown in FIG. 3B, the second output 70*b* is connected to a node between two continuous direct-current power sources in the series connection of the plurality of direct-current power sources 71.

As shown in FIG. 2, the plasma processing apparatus 1 further includes a first switch SW1, a second switch SW2, and a third switch SW3. The first switch SW1 is electrically connected between the first output 70*a* and the lower electrode 18. The second switch SW2 is electrically connected between the second output 70*b* and the lower electrode 18. In the example shown in FIG. 2, the first switch SW1 and the second switch SW2 are connected to a common electric path 74. The electric path 74 is connected to an electric path 64 that connects the radio frequency power source 61 and the lower electrode 18 to each other. The electric path 74 includes a filter 76. The filter 76 is a low-pass filter, and blocks or reduces the radio frequency power from the electric path 64 toward the power source device 70. The third switch SW3 is connected between the ground and the lower electrode 18. In an example, the third switch SW3 is connected between the ground and the electric path 74.

During the execution of the plasma processing using the plasma processing apparatus 1, gas is supplied to the internal space 10*s*. Then, the radio frequency power RF is supplied, whereby the gas is excited in the internal space 10*s*. As a result, plasma is generated in the internal space 10*s*. The substrate W is processed by a chemical species such as ions and/or radicals from the generated plasma.

The plasma processing apparatus 1 further includes a controller MC. The controller MC is a computer which includes a processor, a storage device, an input device, a display device, and the like, and controls each part of the plasma processing apparatus 1. Specifically, the controller MC executes a control program stored in the storage device, and controls each part of the plasma processing apparatus 1, based on recipe data stored in the storage device. The process designated by the recipe data is executed in the plasma processing apparatus 1 under the control by the controller MC. The method MT1 may be executed in the plasma processing apparatus 1 by the control of each part of the plasma processing apparatus 1 by the controller MC.

Figure 4:
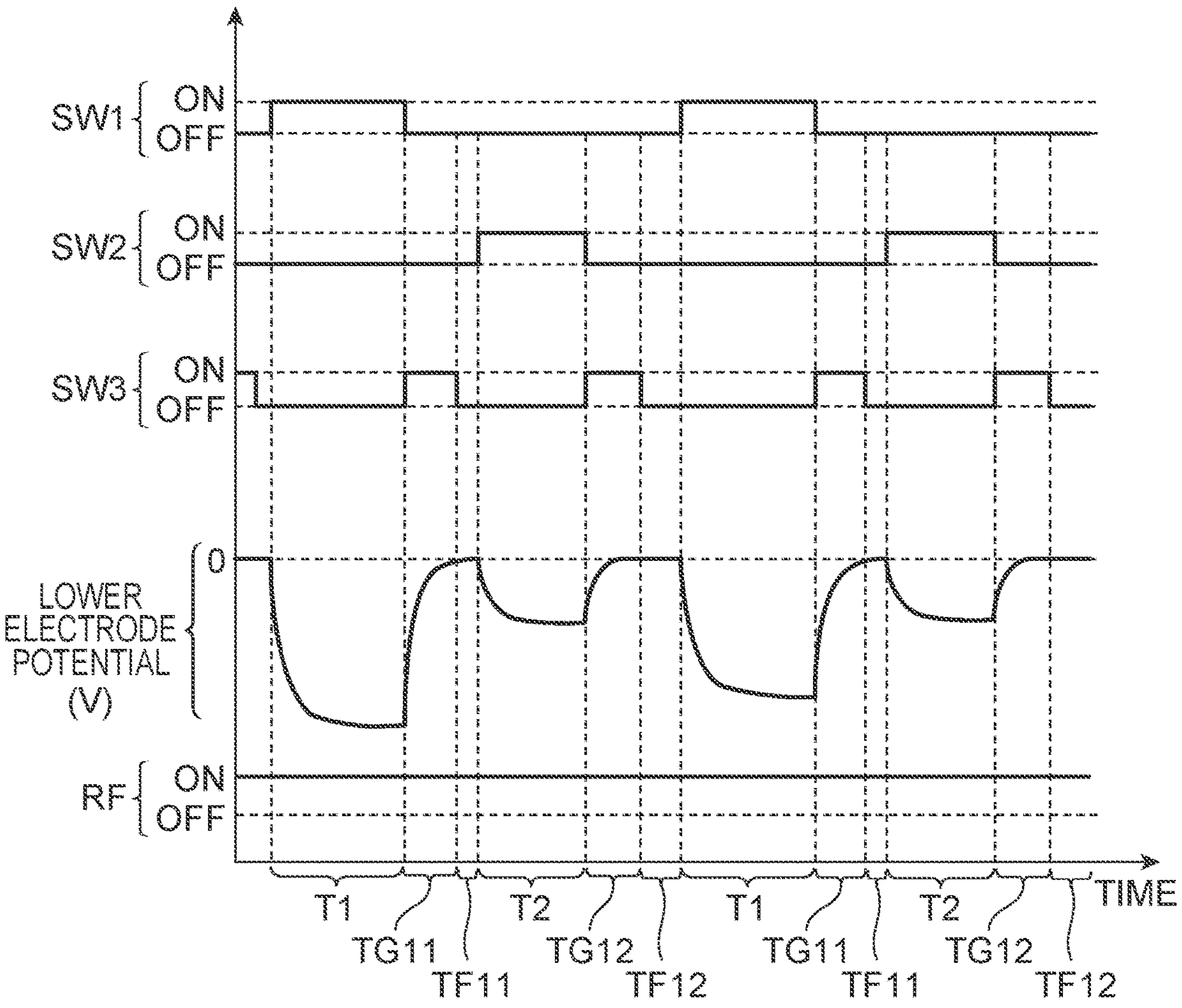
FIG. 4 is a timing chart of an example related to the plasma processing method shown in FIG. 1.

Hereinafter, the method MT1 will be described in detail with reference to FIGS. 1 and 4. Further, in the following, the control of application of a voltage from the power source device 70 to the lower electrode 18 by the controller MC will also be described. FIG. 4 is a timing chart of an example related to the plasma processing method shown in FIG. 1. In FIG. 4, the horizontal axis represents time. In FIG. 4, the vertical axis represents the state of each of the first switch SW1, the second switch SW2, and the third switch SW3, the potential of the lower electrode 18, and the state of the radio frequency power RF. "ON" in the state of each of the first switch SW1, the second switch SW2, and the third switch SW3 indicates a conduction state. "OFF" in the state of each of the first switch SW1, the second switch SW2, and the third switch SW3 indicates a non-conduction state. "ON" in the state of the radio frequency power RF indicates that the radio frequency power RF is being supplied, and "OFF" in the state of the radio frequency power RF indicates that the supply of the radio frequency power is stopped.

The method MT1 is executed in a state where the substrate W is placed on the substrate support 16. The method MT1 includes step STP. In step STP, plasma is generated in the chamber 10. In step STP, a gas is supplied from the gas supply unit to the internal space 10*s*. In step STP, the pressure in the chamber 10 is set to a designated pressure by the exhaust device 50. In step STP, the radio frequency power RF is supplied from the radio frequency power source 61 in order to excite the gas in the chamber 10. For the execution of step STP, the gas supply unit, the exhaust device 50, and the radio frequency power source 61 are controlled by the controller MC. Steps ST1 and ST2 of the method MT1, which are described below, are executed during the generation of plasma in step STP.

Step ST1 is executed in a first period T1. In step ST1, a first direct-current voltage is applied from the power source device 70 to the lower electrode 18. The first period T1 may have a time length determined in advance. The first period T1 includes a period in which the potential of the lower electrode 18 is in a steady state after the first output 70*a* and the lower electrode 18 are connected to each other. In step ST1, the first switch SW1 is set to a conduction state to connect the first output 70*a* and the lower electrode 18 to each other. In step ST1, the second switch SW2 is set to a non-conduction state to break the connection between the second output 70*b* and the lower electrode 18. In step ST1, the third switch SW3 is set to a non-conduction state to break the connection between the ground and the lower electrode 18. For the execution of step ST1, the controller MC executes control (first control) of setting the first switch SW1 to a conduction state and setting the second switch SW2 and the third switch SW3 to a non-conduction state.

Step ST2 is executed in a second period T2. The second period T2 is a period different from the first period T1. In step ST2, a second direct-current voltage is applied from the power source device 70 to the lower electrode 18. The second period T2 may have a time length determined in advance. The second period T2 includes a period in which the potential of the lower electrode 18 is in a steady state after the second output 70*b* and the lower electrode 18 are connected to each other. In step ST2, the second switch SW2 is set to a conduction state to connect the second output 70*b* and the lower electrode 18 to each other. In step ST2, the first switch SW1 is set to a non-conduction state to break the connection between the first output 70*a* and the lower electrode 18. In step ST2, the third switch SW3 is set to a non-conduction state to break the connection between the ground and the lower electrode 18. For the execution of step ST2, the controller MC execute control (second control) of setting the second switch SW2 to a conduction state and setting the first switch SW1 and the third switch SW3 to a non-conduction state.

The method MT1 may further include step STG11 between step ST1 and step ST2. Step STG11 is executed in a period TG11 (a third period). The period TG11 is a period between the point in time of the end of the first period T1 and the point in time of the start of the second period T2. In step STG11, the third switch SW3 is set to a conduction state to connect the lower electrode 18 and the ground to each other. In step STG11, the first switch SW1 is set to a non-conduction state to break the connection between the first output 70*a* and the lower electrode 18. In step STG11, the second switch SW2 is set to a non-conduction state to break the connection between the second output 70*b* and the lower electrode 18. For the execution of step STG11, the controller MC executes control (third control) of setting the third switch SW3 to a conduction state and setting the first switch SW1 and the second switch SW2 to a non-conduction state.

The method MT1 may further include step STF11 between step STG11 and step ST2. Step STF11 is executed in a period TF11. The period TF11 is a period between the point in time of the end of the period TG11 and the point in time of the start of the second period T2. In step STF11, the first switch SW1, the second switch SW2, and the third switch SW3 are set to a non-conduction state. That is, in step STF11, the potential of the lower electrode 18 is set to a floating state. For the execution of step STF11, the controller MC executes control of setting the first switch SW1, the second switch SW2, and the third switch SW3 to a non-conduction state.

In the method MT1, step ST1 and step ST2 may be alternately repeated. In this case, the method MT1 may further include step STG12 between step ST2 and the next step ST1. Step STG12 is executed in a period TG12. The period TG12 is a period between the point in time of the end of the second period T2 and the point in time of the start of the next first period T1. In step STG12, the third switch SW3 is set to a conduction state to connect the lower electrode 18 and the ground to each other. In step STG12, the first switch SW1 is set to a non-conduction state to break the connection between the first output and the lower electrode 18. In step STG12, the second switch SW2 is set to a non-conduction state to break the connection between the second output 70*b* and the lower electrode 18. For the execution of step STG12, the controller MC executes control of setting the third switch SW3 to a conduction state and setting the first switch SW1 and the second switch SW2 to a non-conduction state.

The method MT1 may further include step STF12 between step STG12 and the next step ST1. Step STF12 is executed in a period TF12. The period TF12 is a period between the point in time of the end of the period TG12 and the point in time of the start of the next first period T1. In step STF12, the first switch SW1, the second switch SW2, and the third switch SW3 are set to a non-conduction state. That is, in step STF12, the potential of the lower electrode 18 is set to a floating state. For the execution of step STF12, the controller MC executes control of setting the first switch SW1, the second switch SW2, and the third switch SW3 to a non-conduction state.

The method MT1 may further include step STJ1. In step STJ1, whether or not a stop condition is satisfied is determined. The stop condition is satisfied, for example, in a case where the number of executions of a sequence SQ1 which includes steps ST1 and ST2 has reached a predetermined number of times. If it is determined in step STJ1 that the stop condition is not satisfied, the sequence SQ1 is executed again from step ST1. On the other hand, if it is determined in step STJ1 that the stop condition is satisfied, the method MT1 ends.

As described above, the first direct-current voltage and the second direct-current voltage have the same polarity as each other. Further, the absolute value of one of the first direct-current voltage and the second direct-current voltage is smaller than the absolute value of the other direct-current voltage. Therefore, the energy of ions which are supplied to the substrate W in one period of the first period T1 and the second period T2, in which the direct-current voltage is applied to the lower electrode 18, is lower than the energy of ions which are supplied to the substrate W in the other period. Further, the energy of ions which are supplied to the substrate W in the one period is higher than the energy which is supplied to the substrate W if the potential of the lower electrode 18 is the ground potential. Therefore, ions having the energy between the energy of ions which are supplied to the substrate when a single level direct-current voltage is applied to the lower electrode 18 and the energy of ions which are supplied to the substrate W if the potential of the lower electrode 18 is the ground potential can be supplied to the substrate W.

Figure 5:
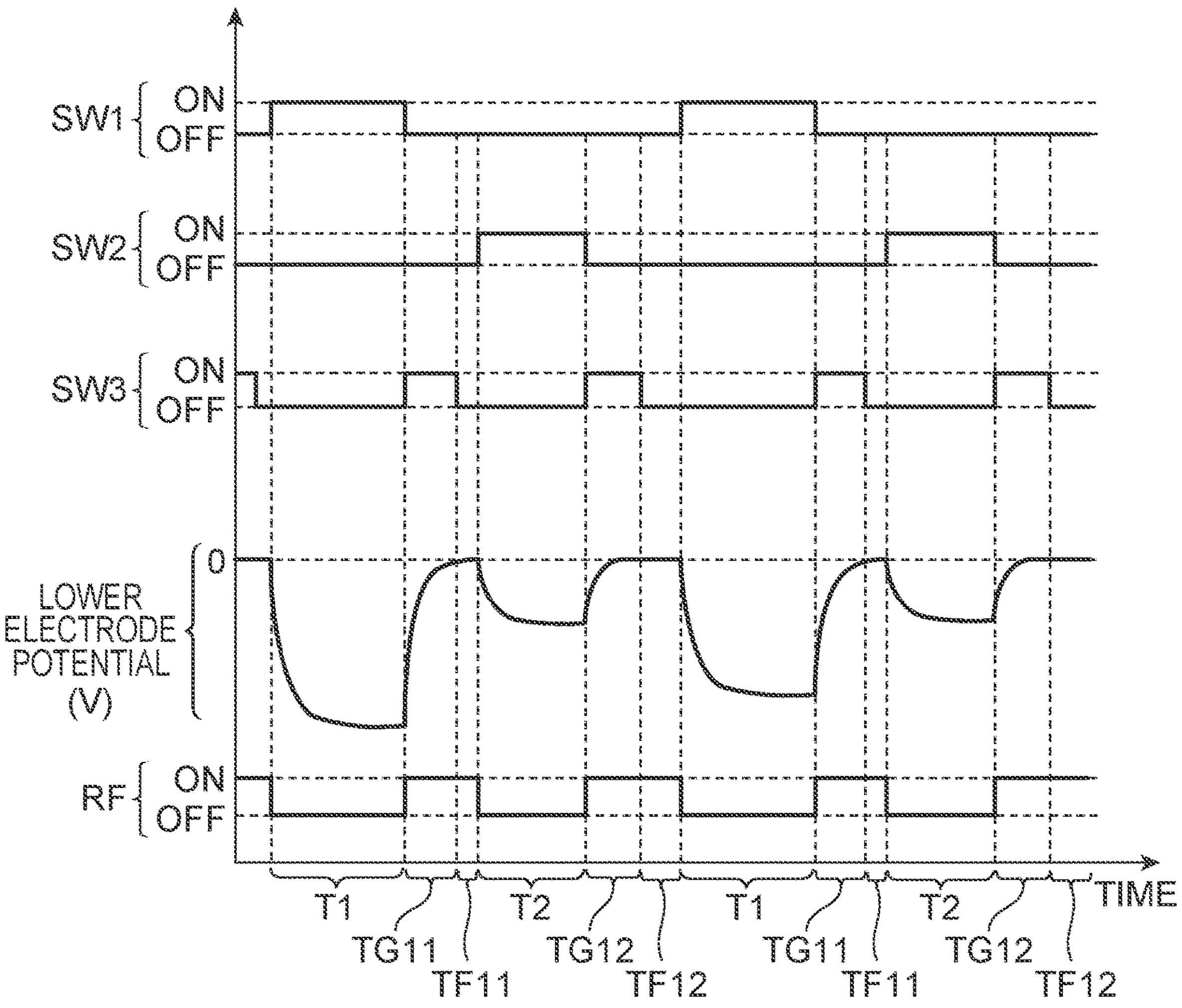
FIG. 5 is a timing chart of another example related to the plasma processing method shown in FIG. 1.

Hereinafter, FIG. 5 will be referred to. FIG. 5 is a timing chart of another example related to the plasma processing method shown in FIG. 1. In the example shown in FIG. 4, the radio frequency power RF is continuously supplied during the execution or repetition of the sequence SQL As shown in FIG. 5, in the method MT1, the supply and the stop of the supply of the radio frequency power RF may be alternately switched. In the example shown in FIG. 5, the supply of the radio frequency power RF is stopped in the first period T1 and the second period T2. In the example shown in FIG. 5, the radio frequency power RF is supplied in periods other than the first period T1 and the second period T2.

Figure 6:
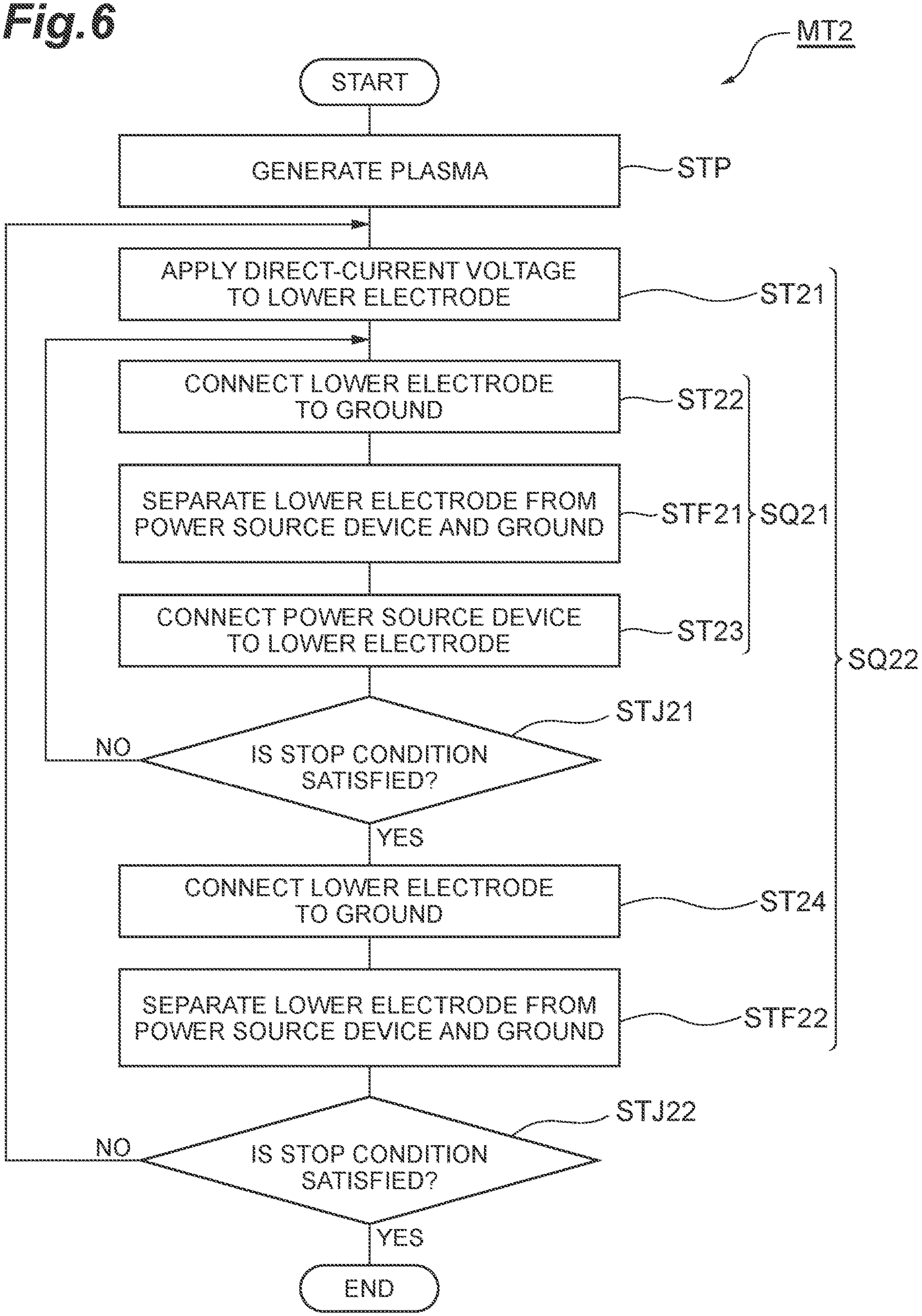
FIG. 6 is a flowchart of a plasma processing method according to another exemplary embodiment.
Figure 7:
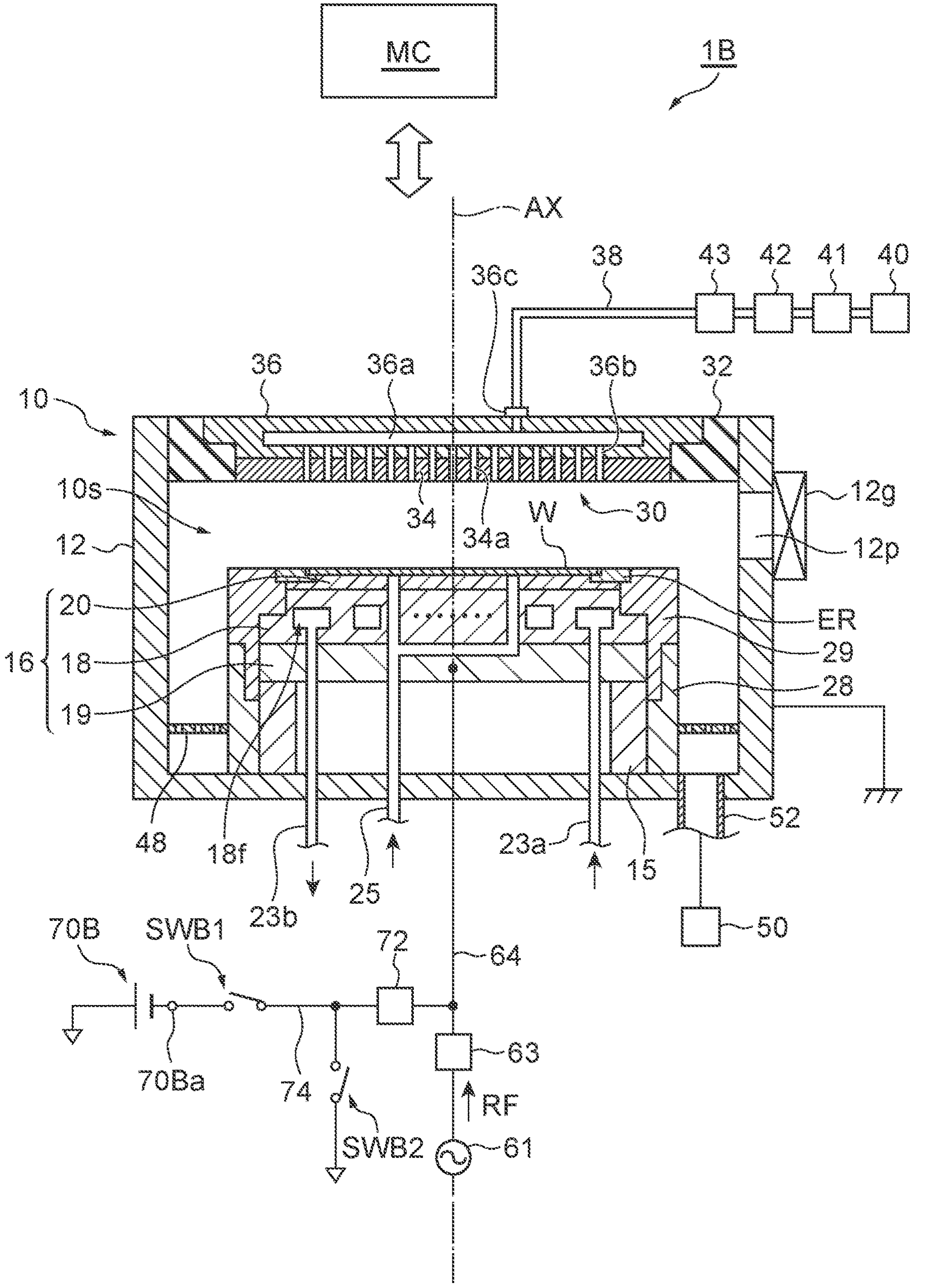
FIG. 7 schematically illustrates a plasma processing apparatus according to another exemplary embodiment.

Hereinafter, a plasma processing method according to another embodiment will be described with reference to FIG. 6. FIG. 6 is a flowchart of the plasma processing method according to another exemplary embodiment. The plasma processing method (hereinafter, referred to as a "method MT2") shown in FIG. 6 is executed using a plasma processing apparatus. FIG. 7 schematically illustrates a plasma processing apparatus according to another exemplary embodiment. Hereinafter, differences of a plasma processing apparatus 1B shown in FIG. 7 from the plasma processing apparatus 1 will be described.

The plasma processing apparatus 1B includes a power source device 70B instead of the power source device 70. The power source device 70B has an output 70Ba. The power source device 70B has a direct-current power source that generates a direct-current voltage, and is configured to output the direct-current voltage from the output 70Ba. The level of the direct-current voltage which is output from the power source device 70B may be a single level.

The plasma processing apparatus 1B may further include a first switch SWB1 and a second switch SWB2. The first switch SWB1 is connected between the output 70Ba of the power source device 70B and the lower electrode 18. The second switch SWB2 is connected between the lower electrode 18 and the ground. In an embodiment, the first switch SWB1 is connected to the electric path 74. The electric path 74 is connected to the electric path 64. The second switch SWB2 is connected between the ground and the electric path 74.

Figure 8:
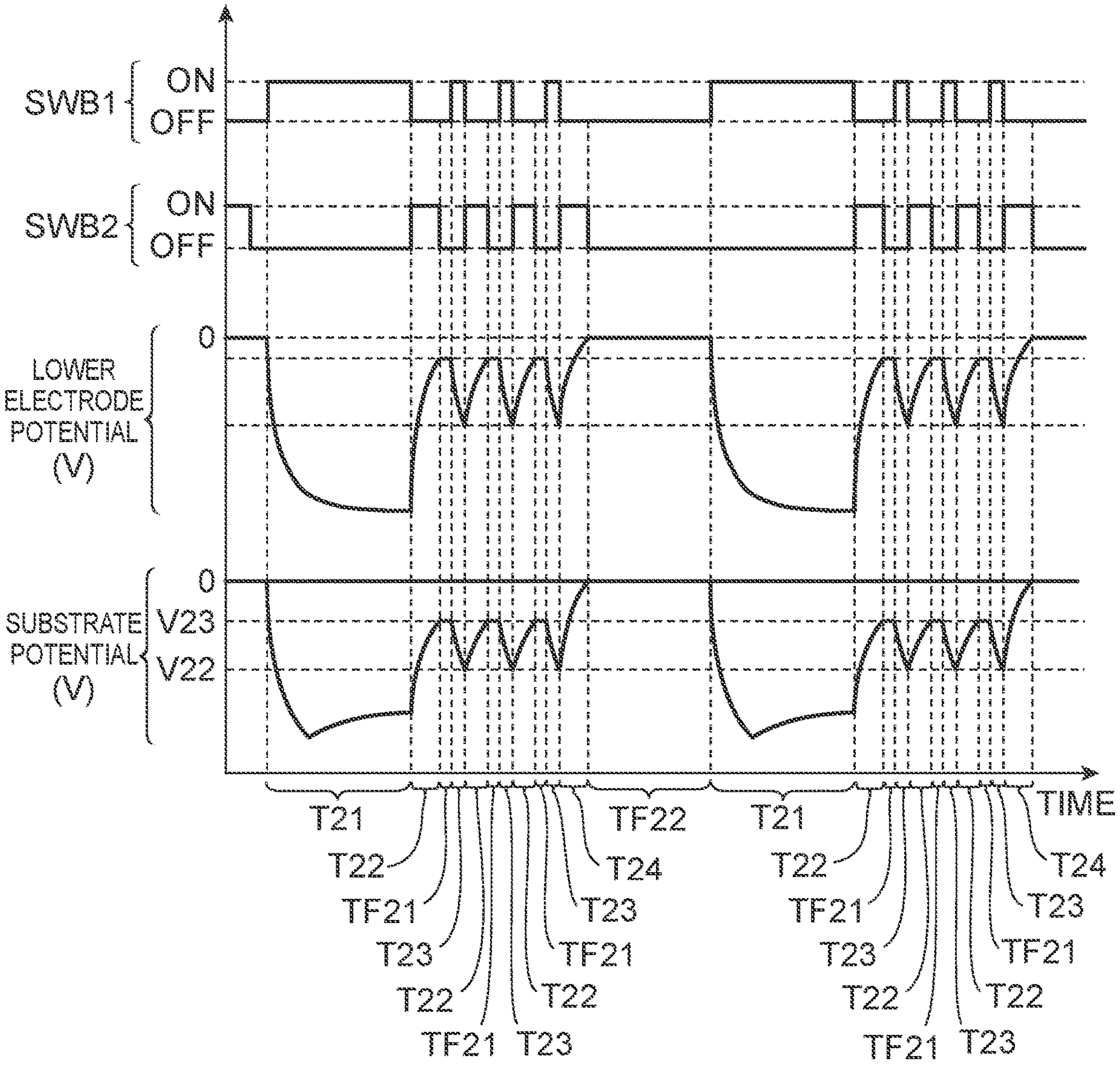
FIG. 8 is a timing chart of an example related to the plasma processing method shown in FIG. 6.

Hereinafter, the method MT2 will be described in detail with reference to FIGS. 6 and 8. Further, in the following, control of application of a voltage from the power source device 70B to the lower electrode 18 by the controller MC of the plasma processing apparatus 1B will be described. FIG. 8 is a timing chart of an example related to the plasma processing method shown in FIG. 6. In FIG. 8, the horizontal axis represents time. In FIG. 8, the vertical axis represents the state of each of the first switch SWB1 and the second switch SWB2, the potential of the lower electrode 18, and the potential of the substrate W. "ON" in the state of each of the first switch SWB1 and the second switch SWB2 indicates a conduction state. "OFF" in the state of each of the first switch SWB1 and the second switch SWB2 indicates a non-conduction state.

The method MT2 is executed in a state where the substrate W is placed on the substrate support 16. As shown in FIG. 6, the method MT2 starts at step STP. Step STP of the method MT2 is the same step as step STP of the method MT1. Also in the method MT2, for the execution of step STP, the gas supply unit, the exhaust device 50, and the radio frequency power source 61 are controlled by the controller MC. Steps ST21, ST22, and ST23 of the method MT2, which are described below, are executed during the generation of plasma in step STP.

Step ST21 is executed in a first period T21. In step ST21, a direct-current voltage is applied from the power source device 70B to the lower electrode 18. The first period T21 may have a time length determined in advance. The first period T21 includes a period in which the potential of the lower electrode 18 is in a steady state after the output 70Ba and the lower electrode 18 are connected to each other. In step ST21, the first switch SWB1 is set to a conduction state to connect the output 70Ba and the lower electrode 18 to each other. In step ST21, the second switch SWB2 is set to a non-conduction state to break the connection between the lower electrode 18 and the ground. For the execution of steps ST21, the controller MC executes control (first control) of setting the first switch SWB1 to a conduction state and setting the second switch SWB2 to a non-conduction state.

Step ST22 is executed in a second period T22. The second period T22 is a period different from the first period T21. In step ST22, the lower electrode 18 is connected to the ground. In step ST22, the lower electrode 18 is electrically separated from the power source device 70B. In step ST22, the second switch SWB2 is set to a conduction state to connect the lower electrode 18 to the ground. In step ST22, the first switch SWB1 is set to a non-conduction state to break the connection between the output 70Ba and the lower electrode 18. For the execution of step ST22, the controller MC executes control (second control) of setting the second switch SWB2 to a conduction state and setting the first switch SWB1 to a non-conduction state. The second period T22 ends before the potential of the lower electrode 18 reaches the ground potential. The time length of the second period T22 may be determined in advance.

Step ST23 is executed in a third period T23. The third period T23 is a period after the second period T22 and starts before the potential of the lower electrode 18 connected to the ground in the second period T22 reaches the ground potential. In step ST23, the power source device 70B is connected to the lower electrode 18. In step ST23, the lower electrode 18 is electrically separated from the ground. In step ST23, the first switch SWB1 is set to a conduction state to connect the output 70Ba and the lower electrode 18 to each other. In step ST23, the second switch SWB2 is set to a non-conduction state to break the connection between the lower electrode 18 and the ground. For the execution of step ST23, the controller MC executes control (third control) of setting the first switch SWB1 to a conduction state and setting the second switch SWB2 to a non-conduction state.

The point in time of the end of step ST23, that is, the point in time of the end of the third period T23 is a point in time before the potential of the lower electrode 18 reaches a steady state. The third period T23 may have a time length determined in advance. At the point in time of the end of the third period T23, the lower electrode 18 is electrically separated from the power source device 70B. That is, at the point in time of the end of the third period T23, the controller MC sets the first switch SWB1 to a non-conduction state.

In an embodiment, the method MT2 may further include step STF21. Step STF21 is executed between step ST22 and step ST23. That is, step STF21 is executed in a period TF21 between the point in time of the end of the second period T22 and the point in time of the start of the third period T23. In step STF21, the lower electrode 18 is electrically separated from both the power source device 70B and the ground. In step STF21, both the first switch SWB1 and the second switch SWB2 are set to a non-conduction state. For the execution of step STF21, the controller MC executes control of setting both the first switch SWB1 and the second switch SWB2 to a non-conduction state.

In an embodiment, step ST22 and step ST23 may be alternately repeated. That is, a sequence SQ21 which includes steps ST22 and ST23 may be repeated. In this case, the method MT2 further includes step STJ21. In step STJ21, whether or not a stop condition is satisfied is determined. The stop condition is satisfied, for example, in a case where the number of executions of the sequence SQ21 has reached a predetermined number of times. If it is determined in step STJ21 that the stop condition is not satisfied, the sequence SQ21 is executed again from step ST22. On the other hand, if it is determined in step STJ21 that the stop condition is satisfied, the repetition of the sequence SQ21 ends.

In an embodiment, a sequence SQ22 which includes step ST21 and the sequence SQ21 may be repeated. The sequence SQ22 may further include step ST24. Step ST24 is executed after the determination in step STJ21. That is, step ST24 is executed in a period T24 after the third period T23.

In step ST24, the lower electrode 18 is connected to the ground. In step ST24, the lower electrode 18 is electrically separated from the power source device 70B. In step ST24, the second switch SWB2 is set to a conduction state to connect the lower electrode 18 to the ground. In step ST24, the first switch SWB1 is set to a non-conduction state to break the connection between the output 70Ba and the lower electrode 18. For the execution of step ST24, the controller MC executes control of setting the second switch SWB2 to a conduction state and setting the first switch SWB1 to a non-conduction state.

The sequence SQ22 may further include step STF22. Step STF22 is executed after step ST24. That is, step STF22 is executed in the period TF22 after the period T24. In step STF22, the lower electrode 18 is electrically separated from both the power source device and the ground. In step STF22, both the first switch SWB1 and the second switch SWB2 are set to a non-conduction state. For the execution of step STF22, the controller MC executes control of setting both the first switch SWB1 and the second switch SWB2 to a non-conduction state.

The method MT2 may further include step STJ22. In step STJ22, whether or not a stop condition is satisfied is determined. The stop condition is satisfied, for example, in a case where the number of executions of the sequence SQ22 has reached a predetermined number of times. If it is determined in step STJ22 that the stop condition is not satisfied, the sequence SQ22 is executed again from step ST21. On the other hand, if it is determined in step STJ22 that the stop condition is satisfied, the method MT2 ends.

In the second period T22, the absolute value of the potential of the lower electrode 18 decreases from the absolute value of the potential of the lower electrode 18 in the first period T21. However, it does not reach zero. Further, in the third period T23, the absolute value of the potential of the lower electrode 18 increases from the absolute value of the potential of the lower electrode 18 in the second period T22. However, it does not reach the same potential as the potential of the lower electrode 18 in the first period T21. Therefore, the energy of ions which are supplied to the substrate W in the second period T22 and the energy of ions which are supplied to the substrate W in the third period T23 are lower than the energy of ions which are supplied to the substrate in the first period T21. Further, the energy of ions which are supplied to the substrate W in the second period T22 and the energy of ions which are supplied to the substrate W in the third period T23 are higher than the energy which is supplied to the substrate W if the potential of the lower electrode 18 is the ground potential. Therefore, ions having the energy between the energy of ions which are supplied to the substrate when a single level direct-current voltage is applied to the lower electrode 18 and the energy of ions which are supplied to the substrate if the potential of the lower electrode 18 is the ground potential can be supplied to the substrate.

Figure 9:
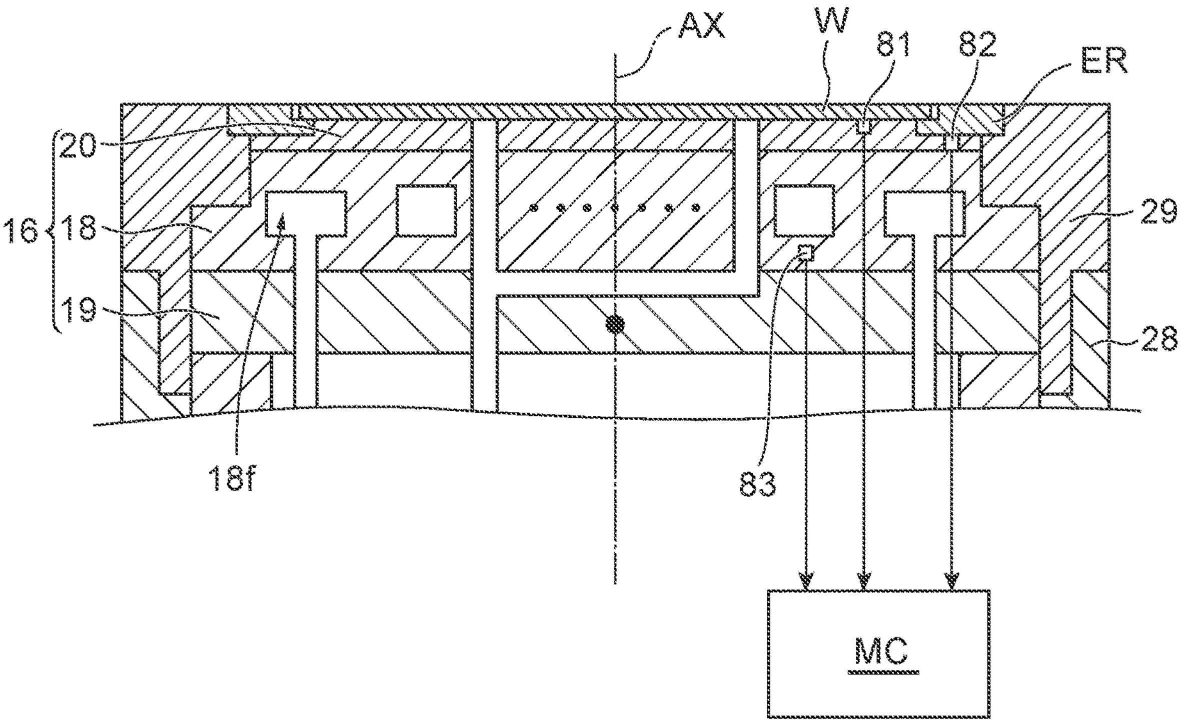
FIG. 9 is a diagram showing an example of one or more potential measurement probes.

Hereinafter, FIG. 8 and FIG. 9 will be referred to. FIG. 9 is a diagram showing an example of one or more potential measurement probes. The plasma processing apparatus 1B may further include one or more potential measurement probes. In the example shown in FIG. 9, the plasma processing apparatus 1B includes a potential measurement probe 81. The potential measurement probe 81 is configured to measure the potential of the substrate W. The controller MC may end step ST22 at the point in time when the potential measured by the potential measurement probe 81 reaches a designated potential V23.

That is, the controller MC may set the second switch SWB2 to a non-conduction state at the point in time when the potential measured by the potential measurement probe 81 reaches the designated potential V23.

Further, the controller MC may end step ST23 at the point in time when the potential measured by the potential measurement probe 81 reaches a designated potential V22. That is, the controller MC may set the first switch SWB1 to a non-conduction state at the point in time when the potential measured by the potential measurement probe 81 reaches the designated potential V22.

In another example, the plasma processing apparatus 1B may further include a potential measurement probe 82 or a potential measurement probe 83 as one or more potential measurement probes. The potential measurement probe 82 is configured to measure the potential of the edge ring ER. The potential measurement probe 83 is configured to measure the potential of the lower electrode 18. The controller MC may end step ST22 at the point in time when the potential measured by the potential measurement probe 82 or the potential measurement probe 83 reaches a designated potential. Further, the controller MC may end step ST23 at the point in time when the potential measured by the potential measurement probe 82 or the potential measurement probe 83 reaches another designated potential.

Figure 10:
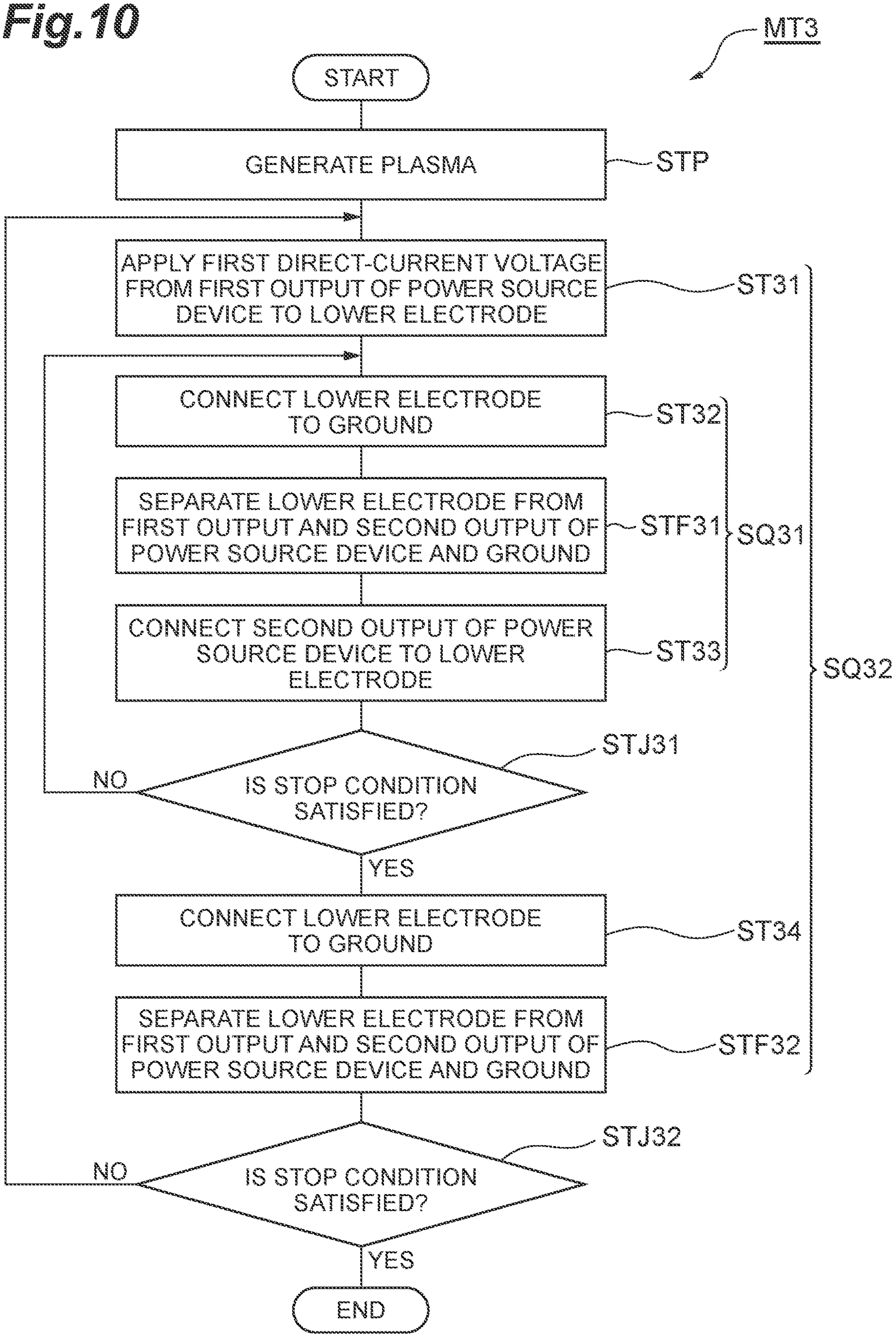
FIG. 10 is a flowchart of a plasma processing method according to still another exemplary embodiment.

Hereinafter, a plasma processing method according to still another embodiment will be described with reference to FIG. 10. FIG. is a flowchart of the plasma processing method according to still another exemplary embodiment. The plasma processing method (hereinafter, referred to as a "method MT3") shown in FIG. 10 is executed using a plasma processing apparatus. For the execution of the method MT3, the plasma processing apparatus 1 may be used. In a case where the plasma processing apparatus 1 is used in the execution of the method MT3, the second direct-current voltage which is output from the second output 70*b* of the power source device 70 has a level (absolute value) lower than the level (absolute value) of the first direct-current voltage which is output from the first output 70*a* of the power source device 70.

Figure 11:
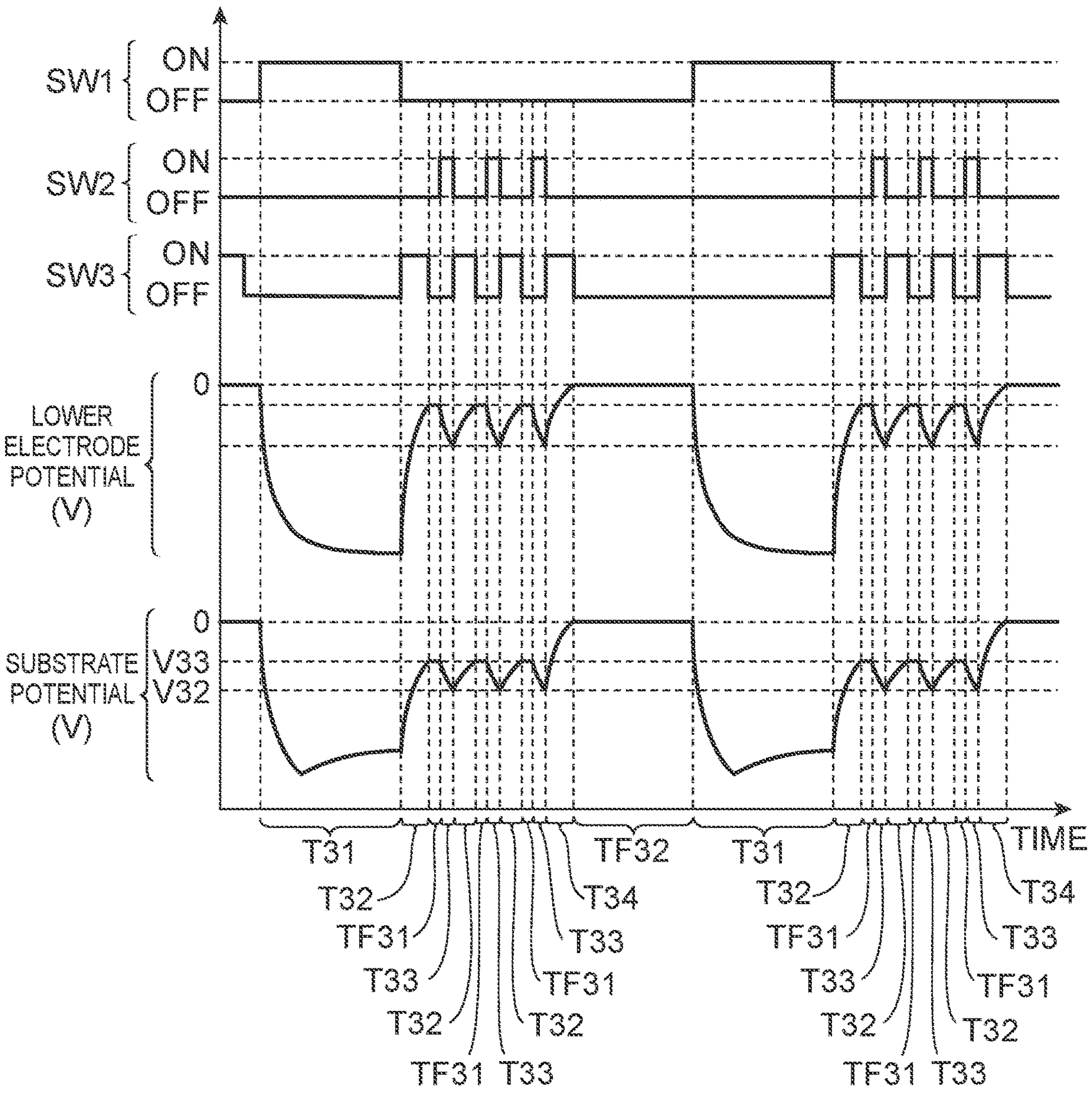
FIG. 11 is a timing chart of an example related to the plasma processing method shown in FIG. 10.

Hereinafter, the method MT3 will be described in detail with reference to FIGS. 10 and 11. Further, in the following, control of application of a voltage from the power source device 70 to the lower electrode 18 by the controller MC of the plasma processing apparatus 1 will also be described. FIG. 11 is a timing chart of an example related to the plasma processing method shown in FIG. 10. In FIG. 11, the horizontal axis represents time. In FIG. 11, the vertical axis represents the state of each of the first switch SW1, the second switch SW2, and the third switch SW3, the potential of the lower electrode 18, and the potential of the substrate W. "ON" in the state of each of the first switch SW1, the second switch SW2, and the third switch SW3 indicates a conduction state. "OFF" in the state of each of the first switch SW1, the second switch SW2, and the third switch SW3 indicates a non-conduction state.

The method MT3 is executed in a state where the substrate W is placed on the substrate support 16. As shown in FIG. 10, the method MT3 starts at step STP. Step STP of the method MT3 is the same step as step STP of the method MT1. Also in the method MT3, for the execution of step STP, the gas supply unit, the exhaust device and the radio frequency power source 61 are controlled by the controller MC. Steps ST31, ST32, and ST33 of the method MT3, which are described below, are executed during the generation of plasma in step STP.

Step ST31 is executed in a first period T31. In step ST31, the first direct-current voltage is applied from the first output 70*a* of the power source device 70 to the lower electrode 18. The first period T31 may have a time length determined in advance. The first period T31 includes a period in which the potential of the lower electrode 18 is in a steady state after the first output 70*a* and the lower electrode 18 are connected to each other. In step ST31, the first switch SW1 is set to a conduction state to connect the first output 70*a* and the lower electrode 18 to each other. In step ST31, the second switch SW2 is set to a non-conduction state to break the connection between the lower electrode 18 and the second output 70*b*. In step ST31, the third switch SW3 is set to a non-conduction state to break the connection between the lower electrode 18 and the ground. For the execution of step ST31, the controller MC executes control (first control) of setting the first switch SW1 to a conduction state and setting the second switch SW2 and the third switch SW3 to a non-conduction state.

Step ST32 is executed in a second period T32. The second period T32 is a period different from the first period T31. In step ST32, the lower electrode 18 is connected to the ground. In step ST32, the lower electrode 18 is electrically separated from the first output 70*a* and the second output 70*b*. In step ST32, the third switch SW3 is set to a conduction state to connect the lower electrode 18 to the ground. In step ST32, the first switch SW1 is set to a non-conduction state to break the connection between the first output 70*a* and the lower electrode 18. In step ST32, the second switch SW2 is set to a non-conduction state to break the connection between the second output and the lower electrode 18. For the execution of step ST32, the controller MC executes control (second control) of setting the third switch SW3 to a conduction state and setting the first switch SW1 and the second switch SW2 to a non-conduction state. The second period T32 ends before the potential of the lower electrode 18 reaches the ground potential. The time length of the second period T32 may be determined in advance.

Step ST33 is executed in a third period T33. The third period T33 is a period after the second period T32 and starts before the potential of the lower electrode 18 connected to the ground in the second period T32 reaches the ground potential. In step ST33, the second output 70*b* is connected to the lower electrode 18. In step ST33, the lower electrode 18 is electrically separated from the first output 70*a* and the ground. In step ST33, the second switch SW2 is set to a conduction state to connect the second output 70*b* and the lower electrode 18 to each other. In step ST33, the first switch SW1 is set to a non-conduction state to break the connection between the lower electrode 18 and the first output 70*a*. In step ST33, the third switch SW3 is set to a non-conduction state to break the connection between the lower electrode 18 and the ground. For the execution of step ST32, the controller MC executes control (third control) of setting the second switch SW2 to a conduction state and setting the first switch SW1 and the third switch SW3 to a non-conduction state.

The point in time of the end of step ST33, that is, the point in time of the end of the third period T33 is a point in time before the potential of the lower electrode 18 reaches a steady state. The third period T33 may have a time length determined in advance. At the point in time of the end of the third period T33, the lower electrode 18 is electrically separated from the second output 70*b* of the power source device 70. That is, at the point in time of the end of the third period T33, the controller MC sets the second switch SW2 to a non-conduction state.

In an embodiment, the method MT3 may further include step STF31. Step STF31 is executed between step ST32 and step ST33. That is, step STF31 is executed in a period TF31 between the point in time of the end of the second period T32 and the point in time of the start of the third period T33. In step STF31, the lower electrode 18 is electrically separated from the first output 70*a*, the second output 70*b*, and the ground. In step STF31, the first switch SW1, the second switch SW2, and the third switch SW3 are set to a non-conduction state. For the execution of step STF31, the controller MC executes control of setting the first switch SW1, the second switch SW2, and the third switch SW3 to a non-conduction state.

In an embodiment, step ST32 and step ST33 may be alternately repeated. That is, a sequence SQ31 which includes steps ST32 and ST33 may be repeated. In this case, the method MT3 includes step STJ31. In step STJ31, whether or not a stop condition is satisfied is determined. The stop condition is satisfied, for example, in a case where the number of executions of the sequence SQ31 has reached a predetermined number of times. If it is determined in step STJ31 that the stop condition is not satisfied, the sequence SQ31 is executed again from step ST32. On the other hand, if it is determined in step STJ31 that the stop condition is satisfied, the repetition of the sequence SQ31 ends.

In an embodiment, a sequence SQ32 which includes step ST31 and the sequence SQ31 may be repeated. The sequence SQ32 may further include step ST34. Step ST34 is executed after the determination in step STJ31. That is, step ST34 is executed in a period T34 after the third period T33.

In step ST34, the lower electrode 18 is connected to the ground. In step ST34, the lower electrode 18 is electrically separated from the first output 70*a* and the second output 70*b*. In step ST34, the third switch SW3 is set to a conduction state to connect the lower electrode 18 to the ground. In step ST34, the first switch SW1 is set to a non-conduction state to break the connection between the first output and the lower electrode 18. In step ST34, the second switch SW2 is set to a non-conduction state to break the connection between the second output 70*b* and the lower electrode 18. For the execution of step ST34, the controller MC executes control of setting the third switch SW3 to a conduction state and setting the first switch SW1 and the second switch SW2 to a non-conduction state.

The sequence SQ32 may further include step STF32. Step STF32 is executed after step ST34. That is, step STF32 is executed in a period TF32 after the period T34. In step STF32, the lower electrode 18 is electrically separated from the first output 70*a*, the second output and the ground. In step STF32, the first switch SW1, the second switch SW2, and the third switch SW3 are set to a non-conduction state. For the execution of step STF32, the controller MC executes control of setting the first switch SW1, the second switch SW2, and the third switch SW3 to a non-conduction state.

The method MT3 may further include step STJ32. In step STJ32, whether or not a stop condition is satisfied is determined. The stop condition is satisfied, for example, in a case where the number of executions of the sequence SQ32 has reached a predetermined number of times. If it is determined in step STJ32 that the stop condition is not satisfied, the sequence SQ32 is executed again from step ST31. On the other hand, if it is determined in step STJ32 that the stop condition is satisfied, the method MT3 ends.

In the second period T32, the absolute value of the potential of the lower electrode 18 decreases from the absolute value of the potential of the lower electrode 18 in the first period T31. However, it does not reach zero. Further, in the third period T33, the absolute value of the potential of the lower electrode 18 increases from the absolute value of the potential of the lower electrode 18 in the second period T32. However, it does not reach the same potential as the potential of the lower electrode 18 in the first period T31. Therefore, the energy of ions which are supplied to the substrate W in the second period T32 and the energy of ions which are supplied to the substrate W in the third period T33 are lower than the energy of ions which are supplied to the substrate in the first period T31. Further, the energy of ions which are supplied to the substrate W in the second period T32 and the energy of ions which are supplied to the substrate W in the third period T33 are higher than the energy which is supplied to the substrate W if the potential of the lower electrode 18 is the ground potential. Therefore, ions having the energy between the energy of ions which are supplied to the substrate when a single level direct-current voltage is applied to the lower electrode 18 and the energy of ions which are supplied to the substrate if the potential of the lower electrode 18 is the ground potential can be supplied to the substrate.

Also in the execution of the method MT3, the potential measurement probe 81, the potential measurement probe 82, or the potential measurement probe 83 may be used. The controller MC may end step ST32 at the point in time when the potential of the substrate W measured by the potential measurement probe 81 reaches a designated potential V33. That is, the controller MC may set the third switch SW3 to a non-conduction state at the point in time when the potential measured by the potential measurement probe 81 reaches the designated potential V33.

Further, the controller MC may end step ST33 at the point in time when the potential of the substrate W measured by the potential measurement probe 81 reaches a designated potential V32. That is, the controller MC may set the second switch SW2 to a non-conduction state at the point in time when the potential of the substrate W measured by the potential measurement probe 81 reaches the designated potential V32.

In another example, the controller MC may end step ST32 at the point in time when the potential of the edge ring ER measured by the potential measurement probe 82 or the potential of the lower electrode 18 measured by the potential measurement probe 83 reaches a designated potential. Further, the controller MC may end step ST33 at the point in time when the potential of the edge ring ER measured by the potential measurement probe 82 or the potential of the lower electrode 18 measured by the potential measurement probe 83 reaches another designated potential.

While various exemplary embodiments have been described above, various additions, omissions, substitutions and changes may be made without being limited to the exemplary embodiments described above. Elements of the different embodiments may be combined to form another embodiment.

For example, the plasma processing apparatus which is used in the method MT1, the method MT2, and the method MT3 may be any type of plasma processing apparatus other than the capacitively-coupled plasma processing apparatus. As such a plasma processing apparatus, an inductively-coupled plasma processing apparatus, a plasma processing apparatus that generates plasma by using a surface wave such as a microwave, or the like can be exemplified. Further, in each of the plasma processing methods according to various embodiments, the number of potential levels which are set to the lower electrode 18 may be more than three.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:

a plasma processing chamber;

a substrate support disposed in the plasma processing chamber;

a first DC power source configured to generate a first DC voltage having a first voltage level;

a second DC power source configured to generate a second DC voltage having a second voltage level different from the first voltage level, the second DC voltage having a same polarity as a polarity of the first DC voltage;

a first switch configured to switch between a first conduction state and a first non-conduction state, the substrate support being connected to the first DC power source in the first conduction state and disconnected from the first DC power source in the first non-conduction state;

a second switch configured to switch between a second conduction state and a second non-conduction state, the substrate support being connected to the second DC power source in the second conduction state and disconnected from the second DC power source in the second non-conduction state;

a third switch configured to switch between a third conduction state and a third non-conduction state, the substrate support being connected to a reference potential in the third conduction state and disconnected from the reference potential in the third non-conduction state; and a controller configured to cause:

the first conduction state of the first switch and the second non-conduction state of the second switch during a first period of a repeating sequence; and the first non-conduction state of the first switch and the second conduction state of the second switch during a second period of the repeating sequence, wherein the controller is configured to control the first switch, the second switch and the third switch to cause:

the first conduction state, the second non-conduction state and the third non-conduction state during the first period of the repeating sequence;

the first non-conduction state, the second conduction state and the third non-conduction state during the second period of the repeating sequence; and the first non-conduction state, the second non-conduction state and the third conduction state during a third period of the repeating sequence between the first period and the second period.

2. The plasma processing apparatus according to claim 1, wherein the controller is configured to control the first switch, the second switch and the third switch to cause the first non-conduction state, the second non-conduction state and the third conduction state during a fourth period of the repeating sequence subsequent to the second period.

3. The plasma processing apparatus according to claim 2, wherein an absolute value of the reference potential is less than an absolute value of the first voltage level and an absolute value of the second voltage level.

4. The plasma processing apparatus according to claim 3, wherein the reference potential is a ground potential.

5. The plasma processing apparatus according to claim 4, wherein the first DC voltage and the second DC voltage have a negative polarity.

6. A plasma processing apparatus comprising:

a plasma processing chamber;

a substrate support disposed in the plasma processing chamber;

a power supply system configured to apply a first DC voltage to the substrate support during a first period of a repeating sequence, and apply a second DC voltage to the substrate support during a second period of the repeating sequence, the first DC voltage having a first voltage level, the second DC voltage having a second voltage level different from the first voltage level, wherein the power supply system is configured to connect the substrate support to a reference potential during a third period of the repeating sequence between the first period and the second period, wherein the power supply system is configured to connect the substrate support to the reference potential during a fourth period of the repeating sequence subsequent to the second period, and wherein an absolute value of the reference potential is less than an absolute value of the first voltage level and an absolute value of the second voltage level.

7. The plasma processing apparatus according to claim 6, wherein the reference potential is a ground potential.

8. The plasma processing apparatus according to claim 7, wherein the first DC voltage and the second DC voltage have a negative polarity.

9. The plasma processing apparatus according to claim 6, wherein the power supply system includes:

a switch configured to switch between a conduction state and a non-conduction state, the substrate support being connected to the reference potential in the conduction state and disconnected from the reference potential in the non-conduction state; and a controller configured to control the switch to cause the non-conduction state during the first and second periods of the repeating sequence, and the conduction state during the third and fourth periods of the repeating sequence.

10. A plasma processing apparatus comprising:

a plasma processing chamber;

a substrate support disposed in the plasma processing chamber;

a DC power source configured to generate a DC voltage;

a first switch configured to switch between a first conduction state and a first non-conduction state, the substrate support being connected to the DC power source in the first conduction state and disconnected from the DC power source in the first non-conduction state;

a second switch configured to switch between a second conduction state and a second non-conduction state, the substrate support being connected to a reference potential in the second conduction state and disconnected from the reference potential in the second non-conduction state; and a controller configured to cause:

maintaining, during a first period, the first conduction state of the first switch and the second non-conduction state of the second switch so as to increase a potential of the substrate support; and maintaining, during a second period, the first non-conduction state of the first switch and the second conduction state of the second switch so as to decrease the potential of the substrate support, wherein the first period and the second period are repeated in an alternating manner so as to transition from the first period to the second period before the substrate support is reached to a maximum potential.

11. The plasma processing apparatus according to claim 10, wherein the controller is configured to cause:

maintaining, during a third period, the first conduction state of the first switch and the second non-conduction state of the second switch until the substrate support is reached to the maximum potential.

12. The plasma processing apparatus according to claim 10, wherein the first period is less than the second period.

13. The plasma processing apparatus according to claim 12, wherein the DC voltage has a first voltage level, an absolute value of the reference potential is less than an absolute value of the first voltage level.

14. The plasma processing apparatus according to claim 13, wherein the reference potential is a ground potential.

15. The plasma processing apparatus according to claim 14, wherein the DC voltage has a negative polarity.

* * * * *